US011520696B2

(12) United States Patent
Williams et al.

(10) Patent No.: US 11,520,696 B2
(45) Date of Patent: Dec. 6, 2022

(54) SEGREGATING MAP DATA AMONG DIFFERENT DIE SETS IN A NON-VOLATILE MEMORY

(71) Applicant: Seagate Technology LLC, Cupertino, CA (US)

(72) Inventors: Steven S. Williams, Longmont, CO (US); Kyumsung Lee, Louisville, CO (US); David W. Claude, Loveland, CO (US)

(73) Assignee: SEAGATE TECHNOLOGY LLC

( * ) Notice: Subject to any disclaimer, the term of this patent is extended or adjusted under 35 U.S.C. 154(b) by 0 days.

(21) Appl. No.: 16/021,166

(22) Filed: Jun. 28, 2018

(65) Prior Publication Data

US 2020/0004670 A1 Jan. 2, 2020

(51) Int. Cl.
*G06F 12/00* (2006.01)
*G06F 12/02* (2006.01)
*G11C 16/04* (2006.01)
*G06F 11/14* (2006.01)
*H01L 25/065* (2006.01)
*G11C 8/12* (2006.01)

(52) U.S. Cl.
CPC ...... *G06F 12/0246* (2013.01); *G06F 11/1441* (2013.01); *G06F 12/0253* (2013.01); *G11C 8/12* (2013.01); *G11C 16/0483* (2013.01); *H01L 25/0657* (2013.01); *G06F 2212/7201* (2013.01); *G06F 2212/7207* (2013.01)

(58) Field of Classification Search
CPC .......................... G06F 12/0246; G06F 12/0253

USPC .......................................................... 711/103
See application file for complete search history.

(56) References Cited

U.S. PATENT DOCUMENTS

| 7,814,351 | B2* | 10/2010 | Lubbers | G06F 3/0689 |
| | | | | 711/6 |
| 9,990,304 | B2* | 6/2018 | Tomlin | G06F 3/0644 |
| 2008/0071972 | A1* | 3/2008 | Kimura | G06F 11/1441 |
| | | | | 711/107 |
| 2008/0263396 | A1* | 10/2008 | Kimura | G06F 11/1441 |
| | | | | 711/E12.001 |
| 2009/0132620 | A1* | 5/2009 | Arakawa | G06F 3/0643 |
| 2010/0080057 | A1* | 4/2010 | Reuter | G11C 5/141 |
| | | | | 365/185.04 |
| 2010/0131827 | A1* | 5/2010 | Sokolov | H03M 13/3707 |
| | | | | 365/45 |
| 2010/0180065 | A1* | 7/2010 | Cherian | G06F 12/0833 |
| | | | | 711/E12.001 |

(Continued)

*Primary Examiner* — Mohamed M Gebril
(74) *Attorney, Agent, or Firm* — Hall Estill Law Firm

(57) ABSTRACT

Apparatus and method for managing metadata in a data storage device, such as a solid-state drive (SSD). In some embodiments, a non-volatile memory (NVM) includes a population of semiconductor memory dies. The dies are connected a number of parallel channels such that less than all of the semiconductor dies are connected to each channel. A controller circuit apportions the semiconductor memory dies into a plurality of die sets, with each die set configured to store user data blocks associated with a different user. A separate set of map data is generated to describe user data blocks stored to each die set. The controller circuit stores the respective sets of map data in the associated die sets so that no die set stores map data associated with a different die set. The die sets may be arranged in accordance with the NVMe (Non-Volatile Memory Express) specification.

17 Claims, 8 Drawing Sheets

(56) References Cited

U.S. PATENT DOCUMENTS

| | | | | |
|---|---|---|---|---|
| 2011/0208933 A1* | 8/2011 | Selfin | G06F 11/1441 | 711/E12.103 |
| 2012/0191937 A1* | 7/2012 | Feldman | G06F 12/0246 | 711/170 |
| 2014/0189209 A1* | 7/2014 | Sinclair | G06F 12/0246 | 711/103 |
| 2014/0317365 A1* | 10/2014 | Meir | G11C 16/225 | 711/162 |
| 2014/0331024 A1* | 11/2014 | Wu | G11C 16/349 | 711/209 |
| 2015/0127883 A1* | 5/2015 | Chen | G06F 3/0679 | 711/103 |
| 2015/0169228 A1* | 6/2015 | Sivasankaran | G06F 3/0659 | 711/103 |
| 2015/0254022 A1* | 9/2015 | Oikawa | G06F 3/0607 | 711/103 |
| 2015/0347025 A1 | 12/2015 | Law | | |
| 2016/0188226 A1* | 6/2016 | Haines | G06F 3/0679 | 711/103 |
| 2016/0313927 A1* | 10/2016 | Lin | G06F 3/0679 | |
| 2017/0024127 A1* | 1/2017 | Bazarsky | G06F 3/0679 | |
| 2017/0123707 A1* | 5/2017 | Carey | G06F 13/4282 | |
| 2018/0067881 A1 | 3/2018 | Frandzel et al. | | |
| 2018/0095675 A1 | 4/2018 | Kachare et al. | | |
| 2018/0101494 A1 | 4/2018 | Davis et al. | | |
| 2018/0136853 A1* | 5/2018 | Choi | G06F 3/0635 | |
| 2018/0189187 A1* | 7/2018 | Cheung | G06F 12/1009 | |
| 2018/0247947 A1* | 8/2018 | Kanno | G06F 12/06 | |
| 2018/0349266 A1* | 12/2018 | Canepa | G06F 11/10 | |
| 2019/0034348 A1* | 1/2019 | Haswell | G06F 12/1009 | |
| 2019/0102110 A1* | 4/2019 | Shaharabany | G06F 3/0688 | |
| 2019/0155749 A1* | 5/2019 | Hahn | G06F 12/126 | |
| 2019/0354452 A1* | 11/2019 | Mehra | G06F 11/10 | |
| 2020/0125447 A1* | 4/2020 | Hosmani | G06F 3/0619 | |
| 2022/0066975 A1* | 3/2022 | Ganesan | G06F 13/4282 | |

* cited by examiner

SEGREGATING MAP DATA AMONG DIFFERENT DIE SETS IN A NON-VOLATILE MEMORY

SUMMARY

Various embodiments of the present disclosure are generally directed to the management of metadata in a memory, such as but not limited to a flash memory in a solid state drive (SSD).

In accordance with some embodiments, a non-volatile memory (NVM) includes a population of semiconductor memory dies. The dies are connected a number of parallel channels such that less than all of the semiconductor dies are connected to each channel. A controller circuit apportions the semiconductor memory dies into a plurality of die sets, with each die set configured to store user data blocks associated with a different user. A separate set of map data is generated to describe user data blocks stored to each die set. The controller circuit stores the respective sets of map data in the associated die sets so that no die set stores map data associated with a different die set. The die sets may be operated in accordance with the NVMe (Non-Volatile Memory Express) specification.

These and other features which may characterize various embodiments can be understood in view of the following detailed discussion and the accompanying drawings.

DETAILED DESCRIPTION

Figure 1:
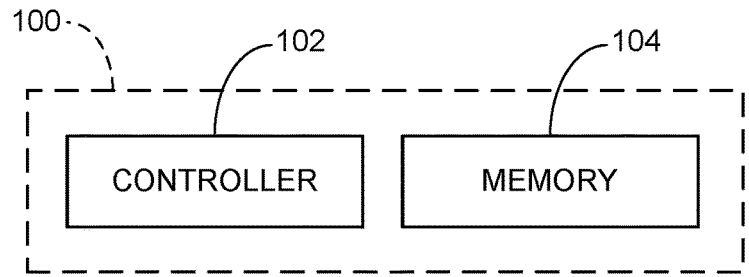
FIG. 1 provides a functional block representation of a data storage device in accordance with various embodiments.

Solid state drives (SSDs) are data storage devices that store user data in non-volatile memory (NVM) made up of an array of solid-state semiconductor memory cells. SSDs usually have an NVM module and a controller. The controller directs the transfer of user data between the NVM and a host device. The NVM will usually be NAND flash memory, but other forms of solid-state memory can be used.

The NVMe specification is an industry adopted standard that describes various interface and operational characteristics of SSDs and other NVM storage devices. The NVMe specification allows different portions of an SSD storage capacity to be assigned to different users for concurrent access and use via one or more PCIe (Peripheral Component Interface Express) interfaces. The portion of the capacity assigned to each NVMe user is referred to as an "NVM set" or "namespace." The specification provides that NVM sets are logically separate and may be physically separate as well, although at present the specification does not go into detail on how an NVM set may be physically separated from the rest of the SSD memory.

Metadata is often generated and used to describe and control the data stored to an SSD. The metadata takes the form of a map structure that tracks the locations of data blocks written to various locations within the flash memory. Because the map structures enable the system to locate, update and retrieve user data blocks, significant system resources are applied to maintain the integrity of the map. As overall data storage capacities continue to increase with successive generations of storage devices, the amount of map data needed to describe the memory space will tend to grow at a corresponding rate, further exasperating the ability to efficiently manage the metadata while maintaining deterministic I/O performance.

Various embodiments of the present disclosure are generally directed to an apparatus and method for managing metadata in an NVM storage device. As explained below, some embodiments provide a solid state drive (SSD) with a controller circuit and a memory coupled to the controller circuit. The memory includes a plurality of semiconductor dies that provide flash memory cells arranged into various substructures such as pages, erasure blocks, garbage collection units (GCUs), planes, etc.

The controller circuit communicates with the dies using a number of channels, or lanes, with multiple dies connected to each channel. The dies are grouped into a number of NVM sets, each having a set of dies connected to an associated group of channels. It is contemplated albeit not necessarily required that each die set will utilize less than all of the available channels.

The controller circuit partitions the map metadata into separate and distinct map data sets, with each map data set describing a different die set. Each map data set, also referred to as a map portion, includes a forward map that provides a flash transition layer (FTL) to relate logical addresses of various data blocks to physical addresses at which the data blocks are stored in the respective die set. The respective map data sets are physically stored in the associated die sets so that each die set stores the map set that describes the user data stored to that die set, and no die set stores the data for a different die set.

In some cases, each map data set may have a different granularity and/or other features tailored to the use of the associated die set by the user. Each map data set may have use a different backup schedule and arrangement to maintain archived copies of the map data. At least some of the map data sets may be stored or retrieved concurrently during archiving, power down (scram) and power up (initialization) operations.

This scheme allows separate map structures to be maintained by the system for different NVMe users, with each map data set being efficiently managed, retained and used based on the requirements of the associated owner of the die set.

These and other features and advantages of various embodiments will be understood beginning with a review of FIG. 1 which shows afunctional block diagram of a data storage device 100. The device 100 has a controller 102 and a memory module 104.

The controller block 102 represents a hardware based and/or programmable processor based circuit configured to provide top level communication and control functions. The memory module 104 includes solid state non-volatile memory (NV: M) for the storage of user data from a host device.

Figure 2:
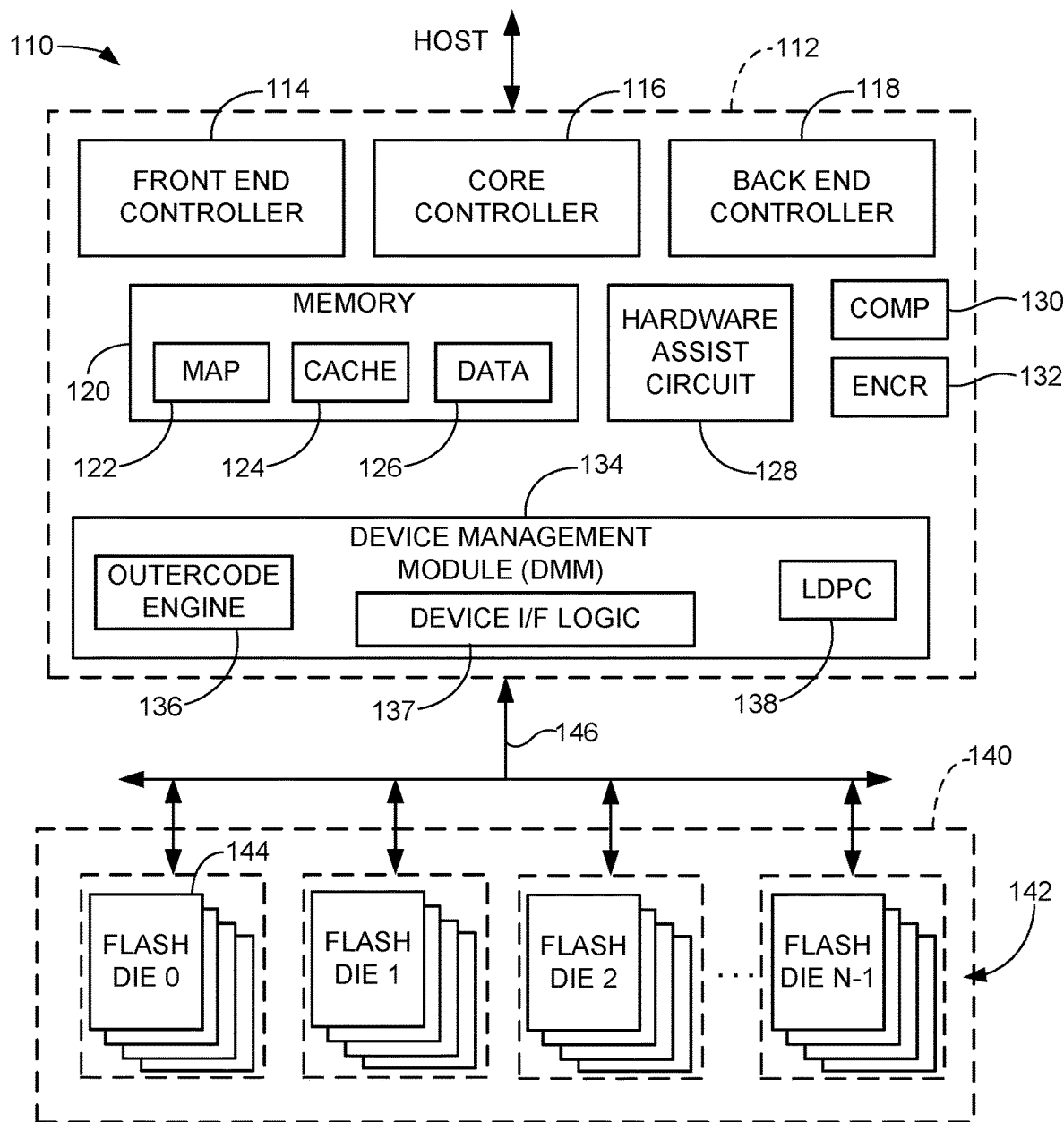
FIG. 2 shows aspects of the device of FIG. 1 characterized as a solid state drive (SSD) in accordance with some embodiments.

FIG. 2 shows a data storage device 110 as a particular embodiment of the device 100 in FIG. 1. The device 110 is configured as a solid state drive (SSD) that communicates with one or more host devices via one or more Peripheral Component Interface Express (PCIe) ports. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVM sets (die sets) for use in the storage of data. Each NVM set may form a portion of an NVMe namespace that may span multiple SSDs or be contained within a single SSI).

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

A device management module (DMM) 134 supports back end processing operations and may include an outer code engine circuit 136 to generate outer code, a device OF logic circuit 137 and a low density parity check (LDPC) circuit 138 configured to generate LDPC codes as part of the error detection and correction strategy used to protect the data stored by the by the SSD 110.

A memory module 140 corresponds to the memory 104 in FIG. 1 and includes a non-volatile memory (NVM) in the form of a flash memory 142 distributed across a plural number N of flash memory dies 144. Rudimentary flash memory control electronics (not separately shown in FIG. 2) may be provisioned on each die 144 to facilitate parallel data transfer operations via a number of channels (lanes) 146.

Figure 3:
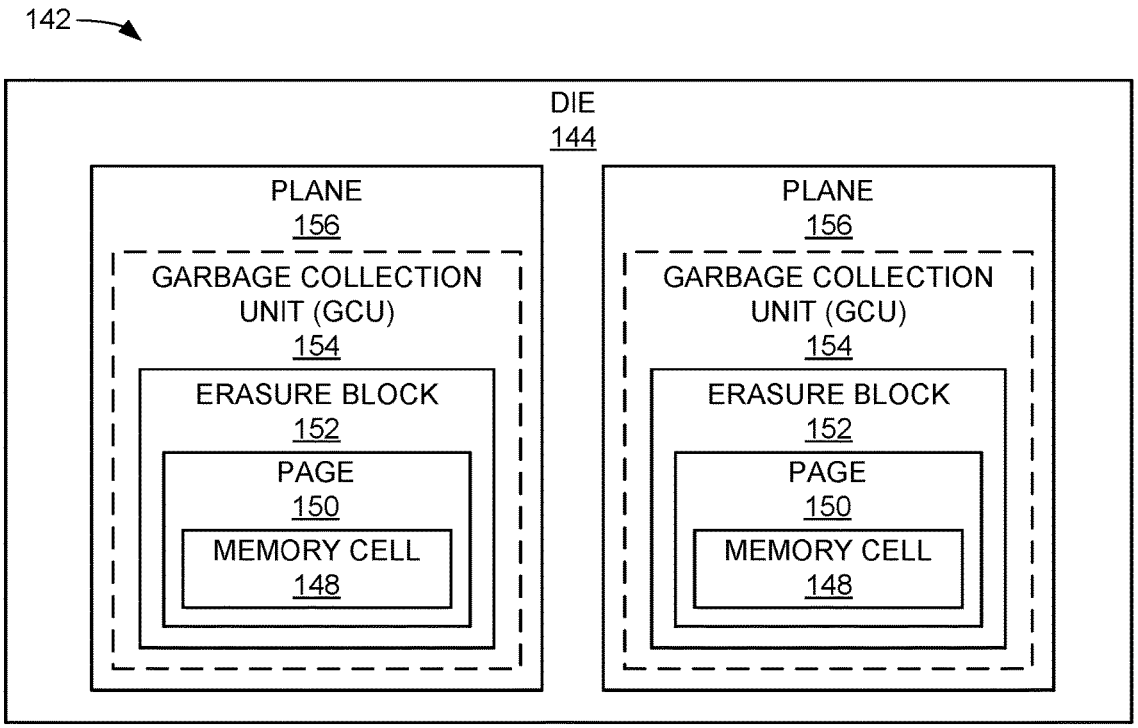
FIG. 3 shows an arrangement of the flash memory of FIG. 2 in some embodiments.

FIG. 3 shows a physical/logical arrangement of the various flash memory dies 144 in the flash memory 142 of FIG. 2 in some embodiments. Each die 144 incorporates a large number of flash memory cells 148. The cells may be arrayed in a two-dimensional (2D) or three-dimensional (3D stacked) arrangement with various control lines (e.g., source, bit, word lines) to access the cells.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), XLCs (four-level cells), and so on. Generally, n bits of data can be stored to a particular memory cell 148 using 2n different charge states (e.g., TLCs use eight distinct charge levels to represent three bits of data, etc.). The storage size of a page can vary; current generation flash memory pages can store, in some cases, 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical structures that utilize erasure blocks that are selected from different dies. GCUs are allocated and erased as a unit. In some embodiments, a GCU may be formed by selecting one or more erasure blocks from each of a population of dies so that the GCU spans the population of dies.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location, followed by an erasure operation to reset the memory cells to an erased (unprogrammed) state. The recycled GCU is returned to an allocation pool for subsequent allocation to begin storing new user data. In one embodiment, each GCU 154 nominally uses a single erasure block 152 from each of a plurality of dies 144, such as 32 dies.

Each die 144 may further include a plurality of planes 156. Examples include two planes per die as shown in FIG. 3, although other numbers of planes per die, such as four planes per die, etc. can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
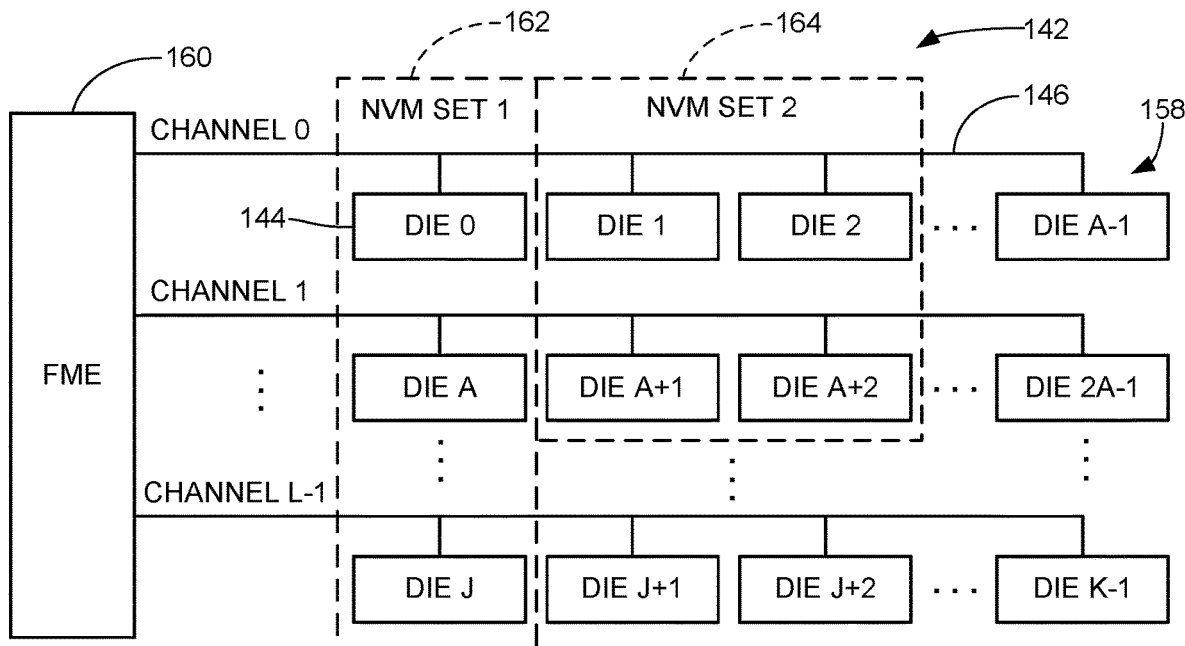
FIG. 4 illustrates the use of channels to access the dies in FIG. 3 in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. A flash memory electronics (FME) circuit 160 of the flash memory module 142 controls each of the channels 146 to transfer data to and from the respective die groups 158. In one example, K is set to 128 dies, L is set to 8 channels, and each physical die group has 16 dies. In this way, any of the 16 dies connected to a given channel 146 can be accessed at a given time using the associated channel.

In some embodiments, the various dies are arranged into one or more NVM sets. An NVM set, also referred to a die set, represents a portion of the storage capacity of the SSD that is allocated for use by a particular host (user/owner). NVM sets are established with a granularity at the die level, so that each NVM (die) set will encompass a selected number of the available dies 144.

A first example NVM set is denoted at 162 in FIG. 4. This first set 162 uses a single die 144 from each of the different channels 146. This arrangement provides fast performance during the servicing of data transfer commands for the set since all eight channels 146 are used to transfer the associated data to service a host access command. A limitation with this approach is that if the set 162 is being serviced, no other NVM sets can be serviced during that time interval. While the set 162 only uses a single die from each channel, the set could also be configured to use multiple dies from each channel, such as four (4) dies per channel for a total of 32 dies.

A second example NVM set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVM sets at the same time, provided the sets do not share the same (e.g., an overlapping) channel 146.

Figure 5:
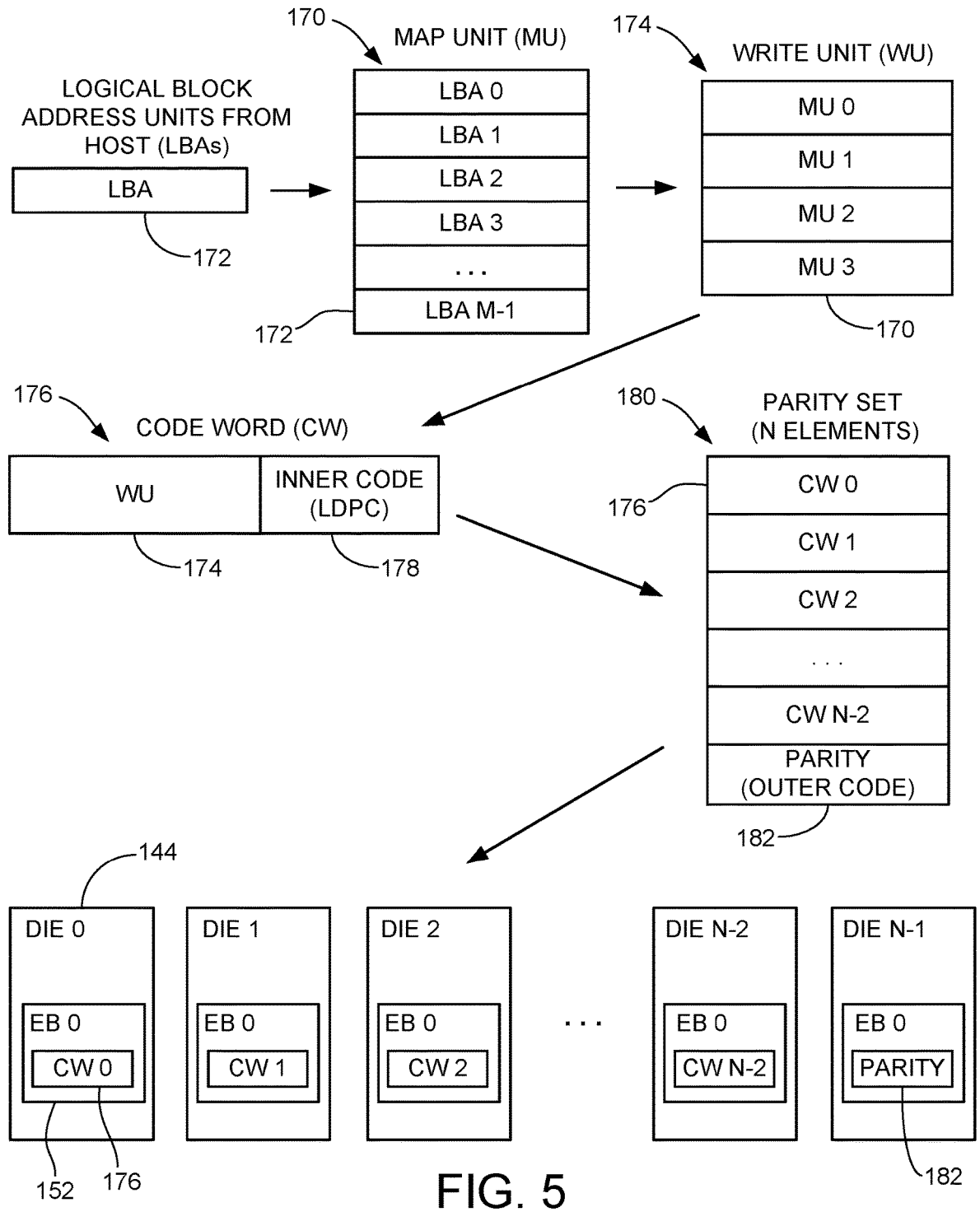
FIG. 5 illustrates a map unit (MU) as a data arrangement stored to the flash memory of FIG. 2.

FIG. 5 illustrates a manner in which user data are stored to the flash memory module 142 in accordance with some embodiments. Map units (MUs) 170 represent fixed sized blocks of data that are made up of one or more user logical block address units (LBAs) 172 supplied by the host. Without limitation, the LBAs 172 may have a first nominal size, such as 512 bytes (B), 1024B (1 KB), etc., and the MUs 170 may have a second nominal size, such as 4096 B (4 KB), etc. The application of data compression may cause each MU to have a smaller size in terms of actual bits written to the flash memory 142.

As noted above, in one example each page 150 represents nominally 16 KB of user data capacity. Hence, each set of four (4) MUs 170 will be grouped together to form a write units (WU) 174 of nominally 16 KB of user data. When dual plane operation is used (see e.g., FIG. 3), each WU can be viewed as constituting eight (8) blocks (MUs) or nominally 32 KB of data since two pages of data can be written simultaneously. Thus, FIG. 5 shows that portion of a WU that is written to a single page.

A code word (CW) 176 is formed by appending, to the WU 174, an inner code value 178. It is contemplated that the inner code constitutes low density parity check (LDPC) codes, although other error correction schemes can be used. The number of code bits will vary, but may be on the order of about 10 KB or so for 16 KB of user data, depending on the construction of the flash memory 142. As will be recognized, LDPC codes enable fast detection and correction of read errors during a read operation. The inner codes 178 may be generated by the LDPC module 138 (see FIG. 2) in preparation of writing of the WU 174 to the flash memory.

Some number of code words 176 are grouped together to form a parity set 180 having N elements. Nominally, the value N will be based on the number of erasure blocks 152 in a given GCU 154, although this is not necessarily required. For the present example, it is contemplated that N=32 although other numbers of elements can be used. As shown in FIG. 5, the parity set 180 will have N-1 code words 176 (e.g., N=31) plus an appended parity value 182. Each of the various code words 176 and the associated parity value 182 are written as a different page of data in the GCU. More particularly, the code words and parity values for a given parity data set may be written to the same page and same designated erasure block (e.g., EB 0) across the respective dies, as shown.

The parity value 182 represents outer code and can take any number of forms. Without limitation, in one embodiment the parity value 182 represents the output of an exclusive-or (XOR) function applied to the N-1 code words 176. In this way, the data from the parity set can still be reconstructed even in the event of a single die failure. It follows that nominally 16 KB of parity data protects (16 KB)(31)=496 KB of user data in each parity set, for an overhead ratio of about 3.2%.

The parity sets stored by the SSD 110 are managed using metadata. The metadata provide map structures to track the locations of various data blocks (e.g., MUs 170) to enable the SSD 110 to locate the physical location of existing data within the flash memory 142. During the servicing of a read command, it is generally necessary to locate the physical address within the flash memory 142 at which the most current version of a requested block (e.g., LBA) is stored, so that the controller can schedule and execute a read operation to return the requested data to the host. During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 6:
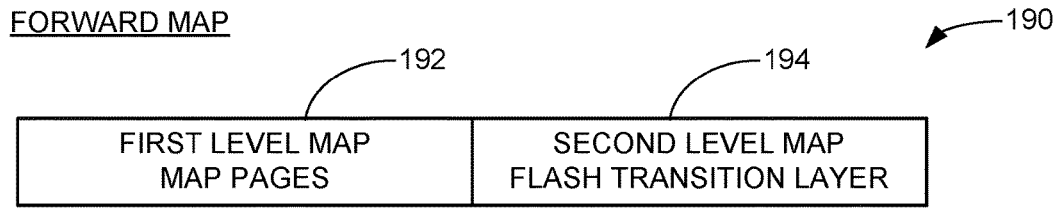
FIG. 6 shows an exemplary format for a forward map used by the SSD in some embodiments.

FIG. 6 shows an example format for a forward map 190 used by the SSD 110 in some embodiments. A two-level map is depicted, although single level or other multi-level maps with three or more levels can be provided as desired.

The forward map 190 includes a first level map 192 and a second level map 194. The first level map 192 provides map pages to identify, for a given range of logical addresses, the entries in the second level map 194. The entries in the second level map 194 provide a flash transition layer (FTL) to generally provide a correlation between the logical addresses of various blocks (e.g., MUs) and the physical addresses at which the various blocks are stored (e.g., NVM set, die, plane, GCU, EB, page, bit offset, etc.).

Forward pointers may be written to the various entries such that, when accessing the map pages and FTL entries, a forward search may take place to locate the final, most current version of a given data block. Once this location is identified, the associated data can be retrieved, etc.

It is generally required that accurate map data be maintained in order to reconstruct the state of the system. A local copy of the map data (or portions thereof) may be maintained in local volatile memory for ease of use by the controller 112. From time to time, the map data may be updated and transferred to the flash memory to provide non-volatile data storage of the map information.

Figure 7:
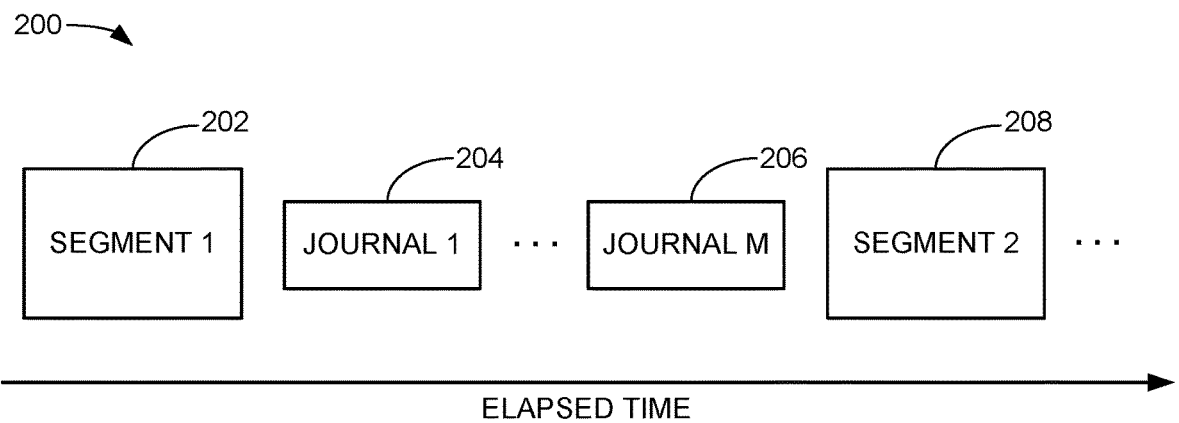
FIG. 7 shows a manner in which the forward map of FIG. 6 is updated over time as a sequence of segments (snapshots) and intervening journal updates in some embodiments.

FIG. 7 shows a sequence 200 to illustrate a manner in which the map data 190 from FIG. 6 is updated to the flash memory 142 over time. A first segment 202 represents an up-to-date representation (snapshot) of the map data at a particular instance in time. Once the segment 202 is written to flash, one or more journal updates such as 204, 206 are written to flash. Each journal update provides a listing of the changes and updates that have occurred since the most recent snapshot. A second segment is shown at 208, which represents the data of the first snapshot plus all of the updates provided by the intervening journals 204, 206.

During operation, the controller 112 (FIG. 2) continuously carries out multiple functions to service the users of the various NVM sets. These functions can be described as (1) hot data transfers, involving the writing of new user data to, or the reading of previously stored user data from, the flash memory 142 in accordance with FIG. 5; (2) cold data transfers, involving garbage collection operations in which current version data are collected and relocated to a new location and a given GCU is erased to place the GCU in condition to accept new data; and (3) map data transfers, where map updates in the form of segments and journals as in FIG. 7 are transferred to the flash memory.

Figure 8:
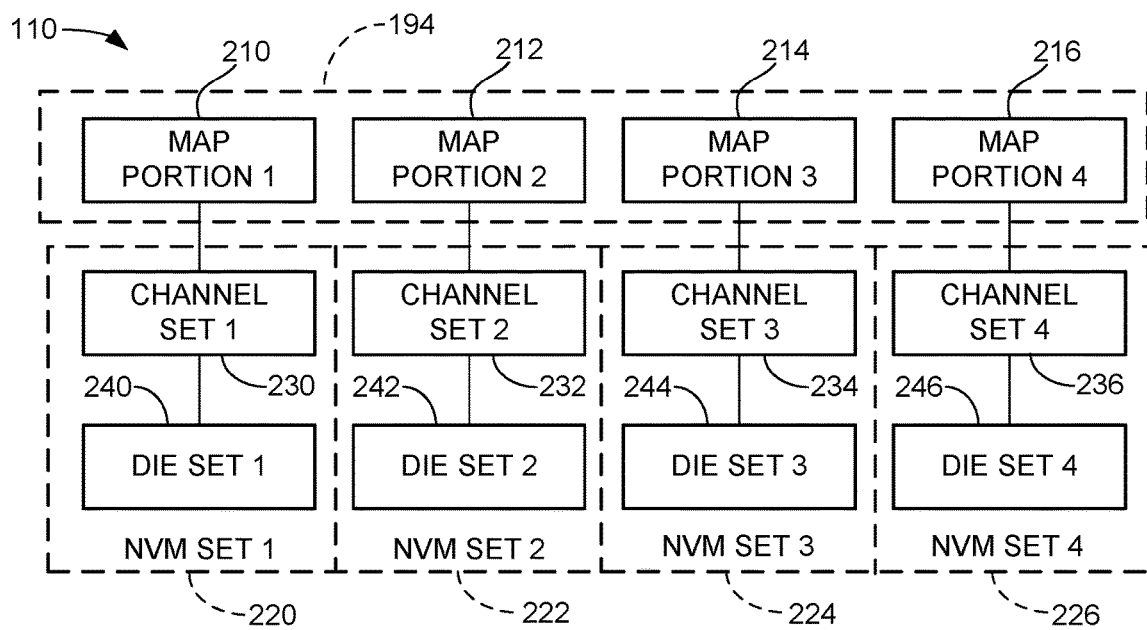
FIG. 8 shows the segregation of the forward map into various map portions for different channel and die sets in accordance with some embodiments.

To this end, various embodiments of the present disclosure divide the forward map 190 into a number of separate sets of map data, each dedicated to describing the user data in each NVM set. FIG. 8 shows the forward map 190 arranged into four (4) distinct and independent sets of map data, also referred to as map portions 220, 222, 224, 226. The map portions are denoted as map portions 1-4 and serve to describe the user data in four (4) corresponding NVM sets 220, 222, 224, 226 (NVM sets 1-4).

The NVM sets 1-4 each have an associated channel set 230, 232, 234, 236 and an associated die set 240, 242, 244, 246. In one example, each of the channel sets 1-4 constitutes two (2) of the eight (8) available channels 146, although other arrangements can be used so that the channel sets are overlapping and shared by two or more of the NVM sets. The map portions 1-4 each independently describe the user data stored in the associated die sets 1-4.

Figure 10:
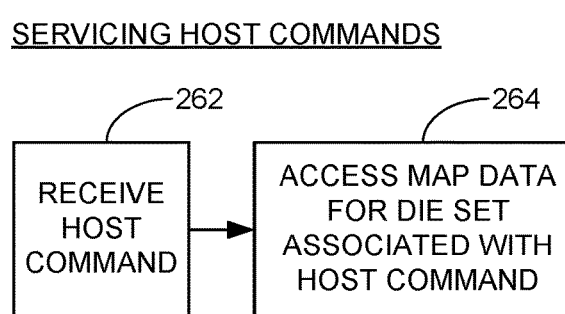
FIG. 10 is a sequence diagram illustrating steps carried out during the servicing of host commands by the SSD in some embodiments.

FIG. 10 shows further aspects of the SSD 110 in some embodiments. Current versions of the respective map portions 1-4 are maintained in a local cache memory 250, such as DRAM. The cache memory 250 also stores cached user data 251 during data transfers with the flash memory 142.

The map portions 1-4 represent the second level map 194 (see FIG. 6) to provide the required flash transition layer (FTL) logical to physical addressing to access the flash memory 142. The first level map 192 is stored in a separate local memory, such as on-chip SRAM 252 accessible by an I/O controller (processor) 254 that provides overall data transfer control.

The combined size of the map portions 1-4 can be significantly smaller than a single map that describes the entire flash memory space. This reduction in size arises in part because fewer bits may be required for each map entry to index the smaller corresponding flash space. This provides a number of benefits including faster writes, smaller memory requirements, as well as the ability to concurrently write multiple portions to the flash memory 142 at the same time. Different granularities can be applied to each map portion in turn, including block sizes, parity data set sizes, GCU sizes, etc. Using different map portions thus allows the map data to be tailored to the requirements of a given user.

Figure 9:
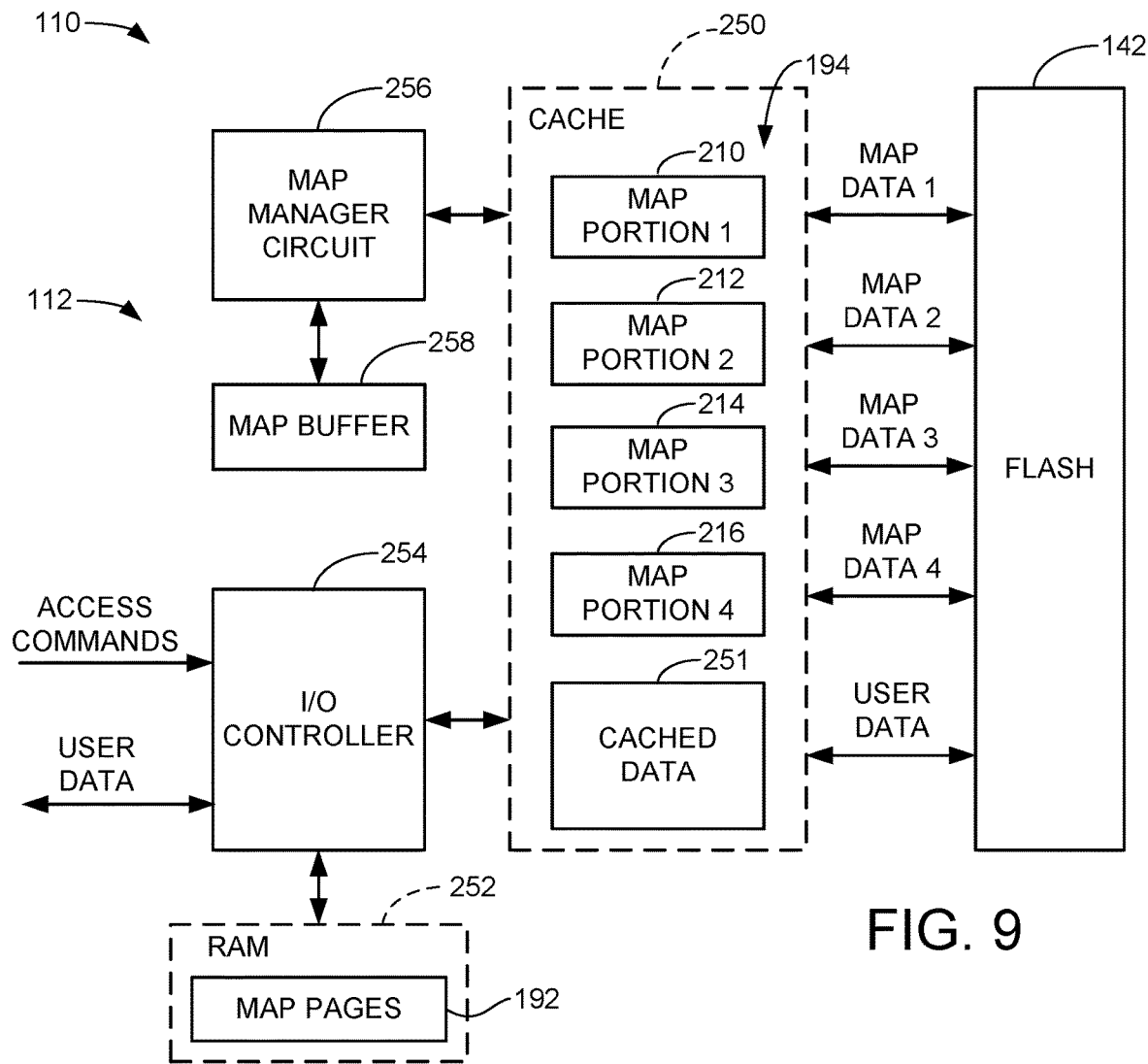
FIG. 9 shows a map manager circuit configured to manage the map portions of FIG. 8 in some embodiments.

FIG. 9 further shows a map manager circuit 256 that manages the map portions. Both the map manager circuit 256 and the I/O processor 254 form a portion of the controller 112 in FIG. 2 and may be realized using hardware and/or programmable processor circuitry. All of the map portions 1-4 can be maintained in the cache memory 250 for rapid access by the map manager circuit 256. However, in another embodiment subsets of the map portions can be transferred in and out of the cache 250 from the flash memory 142 as required to service pending host commands.

The map manager circuit 256 manages the periodic transfer of segments and journal updates to the flash memory. A map buffer 258 can be used by the map manager circuit 256 to generate outer code parity values to provide error correction for the written map data. In some cases, the map data may be arranged in a manner similar to the user data parity sets discussed above in FIG. 5.

Operation of the circuitry in FIG. 9 can be understood with a review of FIG. 10, which provides a sequence diagram 260 for the servicing of host access commands. A host access command is received from a selected host at block 262 to carry out a selected data transfer operation, such as the writing of data to or the reading of data from the flash memory. The host command will be associated with a selected one of the NVM sets and will be initially processed and placed in a queue pending action by the I/O controller 254.

At block 264, the map manager circuit 256 accesses the appropriate map portion for the command to locate the physical address of data in the flash associated with the command. The host command is serviced at block 266 using the map data accessed in block 264. For a read command, the dies, planes, GCU, EBs, pages, etc. that describe the MU(s) that contain the requested data are accessed and processed to return the requested data to the cache 250. For a write command, the write data are accumulated into one or more parity sets and written as described above in FIG. 5. The map data is updated at block 268 to reflect the new location of the most current version of data, to update an accumulated read count or other use parameters, etc.

Figure 11:
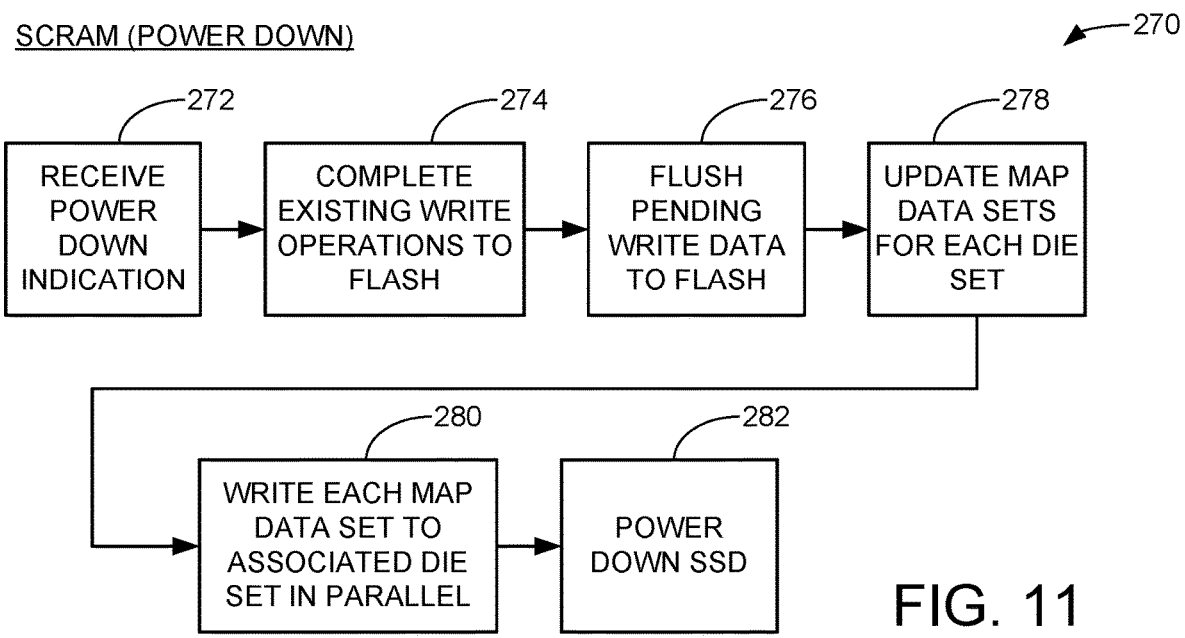
FIG. 11 is a sequence diagram illustrating steps carried out during power down (scram) operations of the SSD in some embodiments.

FIG. 11 provides a power down, or scram sequence 270 to set forth steps carried out when the SSD 110 is deactivated. As noted above, the loss of power causes the SSD 110 to enter the scram mode to prepare the device for deactivation, including the writing of user data and map data to flash or other non-volatile memory locations.

A power down indication is received at block 272. This indication will be provided by the sensing of an anomalous power event by power circuitry of the device, such as by sensing a drop in the magnitude of a source voltage supplied by an external source, receipt of a power down control signal, etc. It is contemplated that the SSD 110 will include on-board power capabilities to supply short term power to facilitate a safe shut-down of the device, such as in the form of a battery, a capacitor, etc. The power down indication will interrupt the normal servicing of host commands discussed above in FIG. 10.

At block 274, the I/O processor 254 will proceed to complete any existing write operations that are ongoing at the time of the power down notification, followed by the flushing of any pending write data to flash at block 276. The associated map portions will be updated to reflect these updated writes. A separate script may be generated to record the operations that were carried out during the shutdown sequence, as desired.

Block 278 shows an updating of the map data sets, which can be carried out concurrently with the flushing operations of block 276. This places the map data in final form prior to the shutdown event. The map data sets are written to each of the associated die sets at block 280. Each die set stores its own map data so that, for example, map portion 1 is written to the die set in NVM Set 1, map portion 2 is written to NVM Set 2, and so on. These transfers can be carried out in parallel depending on the respective arrangements of the die/channel combinations.

Storing the map data to the specific die sets described by the map data ensure that no write conflicts will occur as the device scrambles to flush the user data and the map data to memory. In this scheme, the system will not have to wait for the writing of user data to a first location to be completed before map data associated with some other, second location can be written to the flash memory. Instead, the controller can coordinate the flushing of user data and map data to each NVM set in an orderly fashion well within the remaining power and time budget for the scram sequence.

Once all of the associated data and parameters have been stored, the SSD 110 is allowed to power down at block 282. At this point, the SSD is in a deactivated state, awaiting reinitialization which will now be discussed in FIG. 12.

Figure 12:
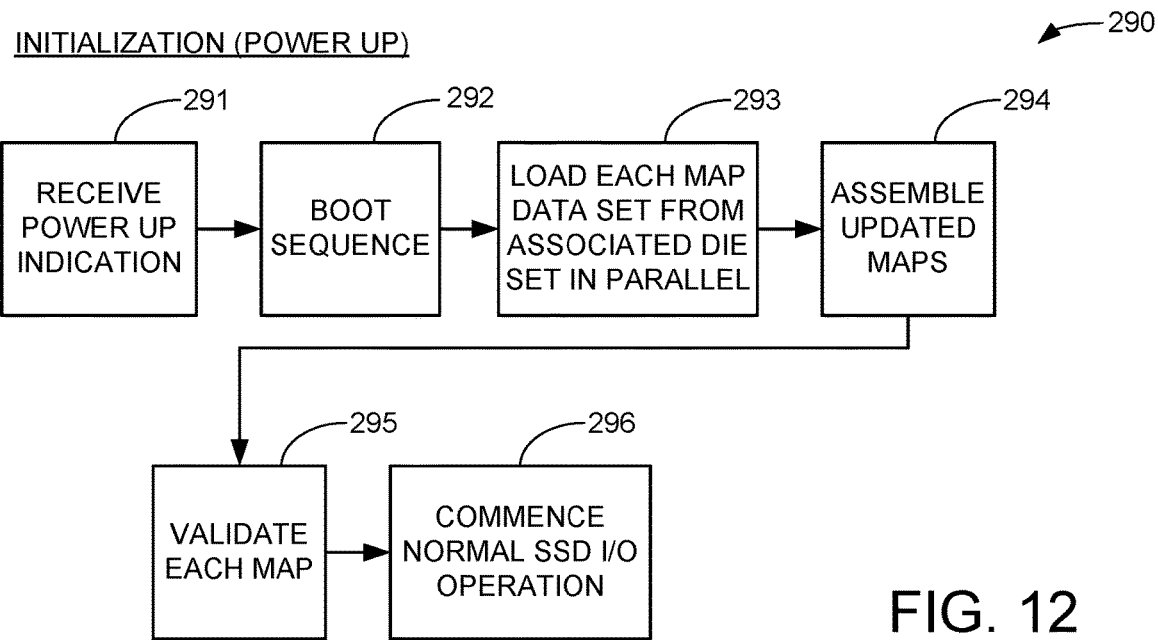
FIG. 12 is a sequence diagram illustrating steps carried out during power up (initialization) operations of the SSD in some embodiments.

FIG. 12 shows an initialization (power up) sequence 290, which commences with a power up indication at block 292. As before, this may be provided by the power control circuitry of the SSD 110 sensing the presence of source voltage or other conditions sufficient to sustain operation of the device. A boot sequence is carried out at block 294, which may include a cold or warm boot initialization.

After the boot sequence, the map data sets are loaded to local memory such as the DRAM cache 250 in FIG. 9, as shown at block 296. The loading of the map portions can be carried out in parallel. It is contemplated albeit not necessarily required that the map data portions may be arranged as segments, updates or other elements that need to be combined in order to generate the final map; if so, these elements are assembled at block 298 to present the available and up-to-date map portions discussed above in FIG. 9. Each map portion may further be validated at block 300, such as through comparison with a script, reverse directory structures, etc. Once validated, the system is ready to commence normal SSD data transfers, block 302.

It follows that the various embodiments presented herein include the apportionment of the map metadata into separate portions, each map portion describing a different physical extent of the flash memory space that can be independently loaded without collisions. In one non-limiting example, an SSD with nominally 4 TB ($4 \times 10^{12}$ bytes) of available capacity can be arranged using map units (MU, see FIG. 5) of 4 KB each. If nominally 4 bytes of map data are required to describe each MU, this provides a map-to-data ratio of 1/1000, or 4 GB ($6 \times 10^9$ bytes) to fully describe the flash memory space if a unitary map structure were used as is conventional in the art.

On the other hand, dividing the 4 TB of capacity into four (4) equally sized die sets would provide four sets of 1 TB each, with each map portion being used to just describe 1 TB of storage space. Even if the same map-to-data ratio is used so that each map portion constitutes 1 GB of data, this is still easier to manage since each (up to) 1 GB of data can be stored and retrieved independently of other data and map portions in the system. However, as noted above it is contemplated that because the overall number of bits required to uniquely address 1 TB of space is less than that required to uniquely address 4 TB of space, a greater ratio than 1/1000 may be possible in at least some situations.

A related advantage of dividing the map into separate map portions relates to the total number of bits required to map the individual addresses. A total of 32 address bits (4 bytes) can address up to 16 TB of data space. As memory capacity continues to grow, 16 TB represents an upper limit of the addressable space using 32 bits (e.g., using a single map structure to address more than 16 TB would require at least a $33^{rd}$ bit/fifth byte in the address). Hence, any number of map divisions can be applied to maintain efficient address sizes.

Dividing the map portions in this manner also ensures that the map data can be independently written to each NVM set as required during the limited time and energy budgets available during shut down and start up routines.

Further reductions in the map-to-data ratio can be achieved using different granularities for different map portions. For example, the entries in a first map portion may be used to describe user data blocks (e.g., MUs) having a first total amount of user data, such as 4 KB described above, and the entries in a second map portion may be used to describe user data blocks (e.g., MUs) having a different, second total amount of user data such as 8 KB, 16 KB, etc. In this case, the second map portion has a larger (more coarse) granularity than the first map portion by some integer multiple (e.g., 2×, 4×, etc.). It follows that fewer entries will be required in the second map portion to describe the associated die set memory space, allowing a corresponding reduction in size of the second map portion. Because each map portion is independent, user selected granularities and other factors can be set to best meet the needs of individual users, which is not possible if a unitary map structure is implemented.

Figure 13:
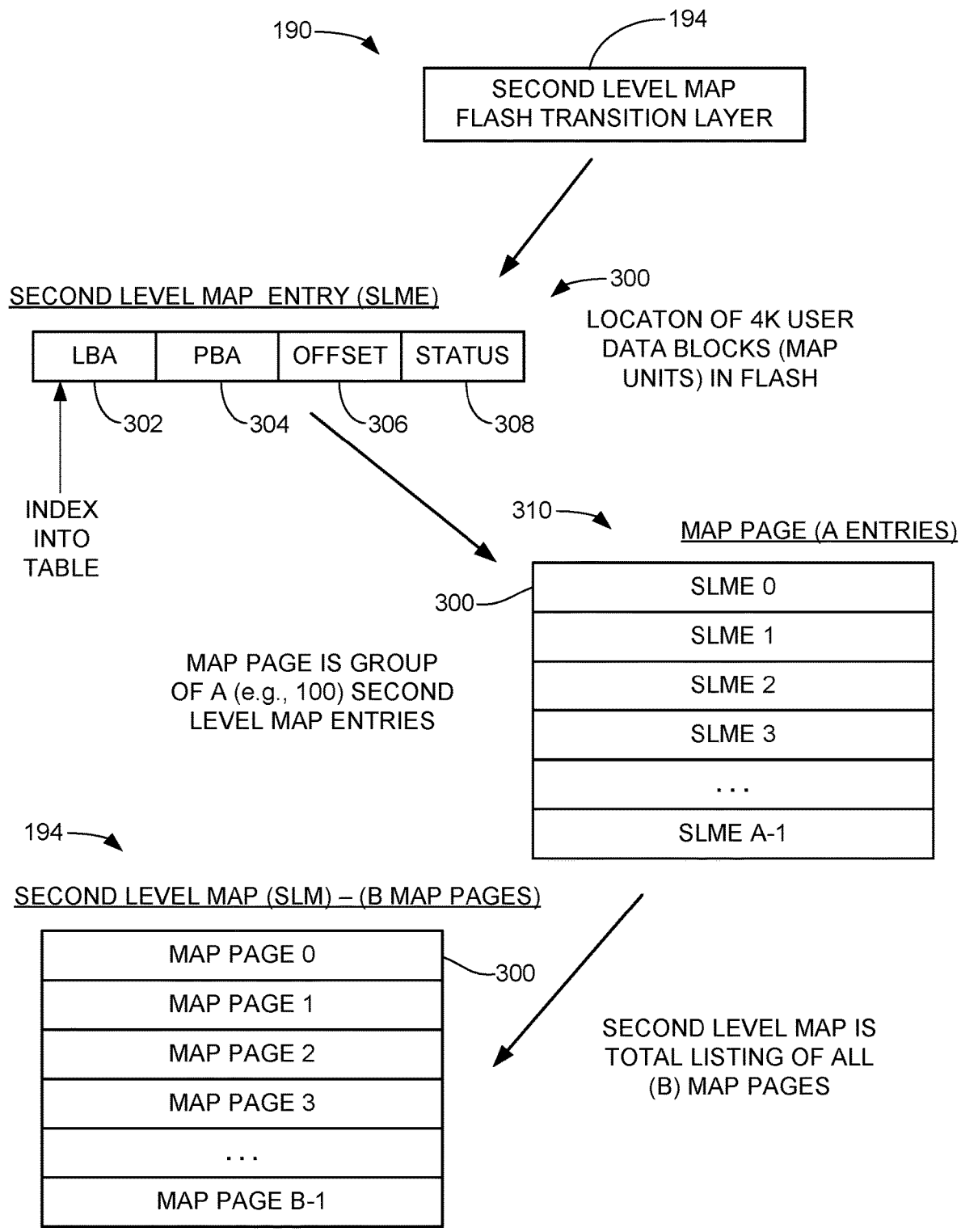
FIG. 13 is an exemplary format for the second level map of FIG. 6 in accordance with some embodiments.

The particular format of the forward map 190 (see FIG. 5) can vary as required. FIG. 13 shows one example for the second level map, or FTL 194 in some embodiments. This is merely to provide a concrete illustration and is not limiting.

As shown in FIG. 13, the second level map 194 is divided up into a number of second level map entries, or SLMEs 300. Each SLME 300 describes individual blocks of user data (e.g. MUs 170) resident in, or that could be written to, that portion of the flash in a particular die set. As noted previously, each MU is nominally set to 4 KB (4096 bytes) in length, although other sizes can be used. The second level map 194 thus describes the entire possible range of logical addresses of blocks that can be accommodated by the associated die set even if certain logical addresses have not been, or are not, used.

Each entry 300 includes a number of fields, including a logical block address (LBA) field 302, a physical block address field 304, an offset field 306 and a status field 308. Other formats may be used. The LBA values are sequential from a minimum value to a maximum value (e.g., from LBA 0 to LBA N with N being some large number determined by the overall data capacity of the SSD). Other logical addressing schemes can be used such as key-values, virtual block addresses, etc. The LBAs are used as an index into the associated data structure to locate the various entries.

As discussed above in FIG. 3, data blocks are arranged as pages which are written along rows of flash memory cells in a particular erasure block. The PBA may be expressed in terms of array, die, garbage collection unit (GCU), erasure block, page, etc. The offset value may be a bit offset along a selected page of memory. The status value may indicate the status of the associated block (e.g., valid, invalid, null, etc.). Other elements can be included as well, such as forward pointers, etc.

Groups of the SLMEs 300 are arranged into larger sets of data referred to herein as map pages 310. Some selected number of entries (represented by the variable A) are provided in each map page. In the present case, each map page 310 has a total of 100 entries. Other groupings of entries can be made in each page, including numbers that are a power of 2.

The second level map 194 thus essentially constitutes an arrangement of all of the map pages 310 in the associated die set. It is contemplated that some large total number of map pages B will be necessary to describe the entire storage capacity of the die set. Each map page has an associated map ID value, which may be a consecutive number from 0 to B. As noted previously, the second level map 194 is maintained in the flash memory and updated as required using segments and journal updates. An up-to-date "working" copy is maintained in local memory (e.g., cache 250, FIG. 9).

Figure 14:
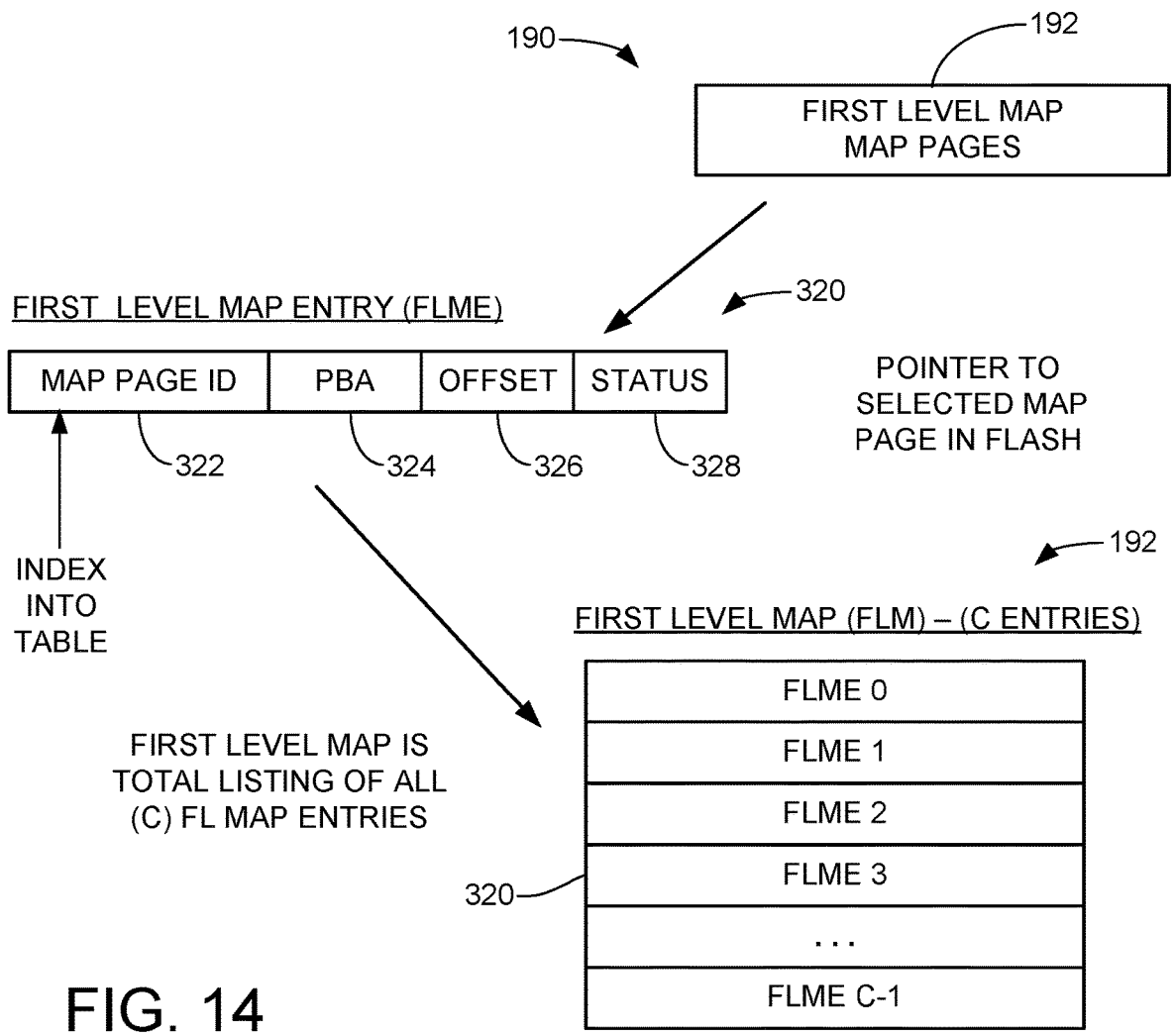
FIG. 14 is an exemplary format for the first level map of FIG. 6 in accordance with further embodiments.

FIG. 14 shows an example format for the first level map 192 from FIG. 5 in some embodiments. As before, this is merely to provide a concrete example and is not limiting. The first level map 192 is also maintained in flash using updates and segments as required, although the size of the first level map may be sufficiently small to enable the entire structure to be stored to flash as a single unit. A working copy of the first level map 192 may also be stored in local memory (e.g., SRAM 252, FIG. 9).

The first level map 192 enables the SSD 110 to locate the various map pages 310 stored to flash. To this end, the first level map 192 is made up of first level map entries 320 (FLMEs or entries). Each FLME 320 has a map page ID field 322, PBA field 324, offset field 326 and status field 328. The map ID was discussed above. The PBA in field 324 describes the location of the associated map page. The offset value operates as before as a bit offset along a particular page or other location. The status value may be the same as in the second level map, or may relate to a status of the map page itself as desired. As before, the map IDs can be used as an index into the data structure to locate the associated entries.

The first level map 192 thus constitutes an arrangement of all of the entries 320 from entry 0 to entry C. In some cases, B will be equal to C, although these values may be different. Accessing the first level map 192 allows a search, by map ID, of the location of a desired map page within the associated die set. Retrieval of the desired map page from flash will provide the second level map entries in that map page, and then individual LBAs can be identified and retrieved based on the PBA information in the associated second level entries.

Figure 15:
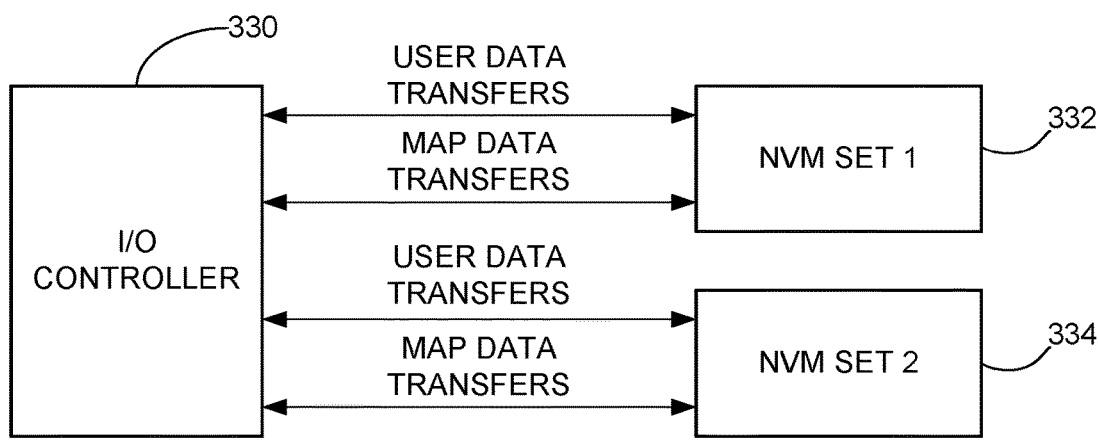
FIG. 15 shows the concurrent storage of user data blocks and map data by a controller to different NVM sets in some embodiments.

FIG. 15 shows a simplified illustration of further aspects of the SSD 110 in some embodiments. An I/O controller circuit 330 generally corresponding to the controllers discussed above interfaces with two respective NVM Sets 1 and 2, denoted at 332 and 334. Generally user data transfers and map data transfers are confined to the respective sets. The user data and map data thus stay in their respective "lanes," allowing the controller 330 to best arrange the storage of each type of data in a manner best determined to maintain deterministic operation of the SSD. For example, the controller may provide periodic storage of the first map portion data to the first NVM set in the form of segments (snapshots) and journal updates at a first rate, and may similarly provide the periodic storage of the second map portion data to the second NVM set as segments/updates at a different, second rate.

It will now be appreciated that the various embodiments present a number of benefits over the art. Providing separate and distinct map portions for each of a number of different NVMe (die) sets can enable more efficient management of the metadata used to control data transfers with each set. While the various embodiments have been described in terms of an SSD in an NVMe environment, other types of storage devices and operational environments can be used as desired. Flash memory is a particularly suitable NVM, but other forms of data storage memory can be used.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   dividing a population of semiconductor memory dies in a non-volatile memory (NVM) into a plurality of die sets each configured to store user data blocks associated with a different user, at least one of the die sets containing two or more of the semiconductor memory dies and each of the die sets separately addressed by an associated user, the semiconductor memory dies connected to the controller using a number of parallel channels so that less than all of the semiconductor memory dies are connected to each channel;
   generating a plurality of data structures, each of the plurality of data structures stored in memory, comprising map data separate from user data, and associating logical addresses of user data blocks with physical addresses for an entirety of a corresponding die set;
   transitioning a data storage device from an activated power state to a deactivated power state in response to an anomalous power event; and
   in response to the anomalous powering down event, storing a first data structure of the plurality of data structures in a corresponding first die set with a second data structure of the plurality of data structures in a corresponding second die set so that no die set stores map data describing user data blocks in a different die set; and
   concurrently transferring the first and second sets from the corresponding first and second die sets to a local cache memory of a controller circuit in response to a powering up event subsequently transitioning the data storage device from the deactivated power state to an activated power state.

2. The method of claim 1, wherein each die set is formed of semiconductor memory dies connected to each of the parallel channels.

3. The method of claim 1, wherein each die set is formed of semiconductor memory dies that are connected to less than all of the parallel channels.

4. Claim 1, wherein the map data of each of the plurality of data structures is characterized as a forward map having a transition layer associating the logical address of each of the user data blocks with the physical address within the corresponding die set at which the user data block is stored.

5. The method of claim 1, wherein the user data blocks are stored at garbage collection units (GCUs) each comprising an erasure block (EB) selected from each die in the associated die set.

6. The method of claim 1, wherein the semiconductor memory dies form a memory space of a data storage device configured in accordance with an NVMe (Non-Volatile Memory Express) specification industry adopted standard, wherein each die set is characterized as an NVM set to provide data storage for a separate NVMe user, and wherein each NVM set is accessed using a PCIe (Peripheral Component Interface Express) interface.

7. The method of claim 1, wherein the storing step comprises concurrently storing at least a first set of map data to a first die set and a second set of map data to a second die set at the same time.

8. The method of claim 1, wherein each of the semiconductor memory dies is characterized as a NAND flash memory die comprising a plurality of flash memory cells in which data are stored.

9. An apparatus comprising:
a non-volatile memory (NVM) comprising a population of semiconductor memory dies to which are connected a number of parallel channels such that less than all of the semiconductor dies are connected to each channel; and
a controller circuit configured to apportion the semiconductor memory dies into a plurality of die sets each configured to store user data blocks associated with a different user, to generate a separate set of map data as a data structure in a memory to describe user data blocks stored to each die set, and in response to a data storage device incorporating the semiconductor memory dies transitioning, in response to an anomalous power event, from an activated power state to a deactivated power state, to concurrently store at least a first set of map data to a first die set and a second set of map data to a second die set, and so that no die set stores map data associated with a different die set.

10. The apparatus of claim 9, wherein each set of map data is characterized as a forward map having a transition layer associating the logical address of each of the user data blocks with the physical address within the corresponding die set at which the user data block is stored.

11. The apparatus of claim 9, characterized as a solid-state drive (SSD) configured in accordance with an NVMe (Non-Volatile Memory Express) specification industry adopted standard, wherein each die set forms a portion of an NVM set to provide data storage for a separate NVMe user which accesses the SSD using at least one PCIe (Peripheral Component Interface Express) interface.

12. The apparatus of claim 9, wherein the NVM comprises NAND flash memory.

13. The apparatus of claim 9, wherein each die set is formed of semiconductor memory dies connected to each of the parallel channels.

14. The apparatus of claim 9, wherein each die set is formed of semiconductor memory dies that are connected to less than all of the parallel channels so that no die set shares the same channel.

15. The apparatus of claim 9, wherein each of the sets of map data is arranged as a plurality of entries, each entry associating a logical address of an associated user data block with a physical address in the associated die set at which the user data block is stored.

16. The apparatus of claim 15, wherein the entries in a first set of map data each describe a different user data block in a first die set having a first total amount of user data, and the entries in a second set of map data each describe a different user data block in a second die set having a second total amount of user data, wherein the second total amount of user data is an integer multiple of the first total amount of user data to provide the first set of map data with a different granularity as compared to a granularity of the second set of map data.

17. The apparatus of claim 9, wherein the controller circuit operates to store a sequence of snapshots and intervening journal updates to the NVM for each of the sets of map data at a different rate.

* * * * *